(12) United States Patent
Halls et al.

(10) Patent No.: US 9,211,566 B2
(45) Date of Patent: Dec. 15, 2015

(54) METHOD OF PREPARING OPTO-ELECTRONIC DEVICE

(71) Applicant: CAMBRIDGE DISPLAY TECHNOLOGY LIMITED, Cambridgeshire (GB)

(72) Inventors: Jonathan Halls, Cambridge (GB); Richard Wilson, Cambridge (GB); Jeremy Burroughes, Cambridgeshire (GB)

(73) Assignee: CAMBRIDGE DISPLAY TECHNOLOGY LIMITED, Cambridgeshire (GB)

( * ) Notice: Subject to any disclaimer, the term of this patent is extended or adjusted under 35 U.S.C. 154(b) by 426 days.

(21) Appl. No.: 13/728,911

(22) Filed: Dec. 27, 2012

(65) Prior Publication Data
US 2013/0171770 A1    Jul. 4, 2013

Related U.S. Application Data

(60) Division of application No. 11/721,332, which is a continuation of application No. PCT/GB2005/004678, filed on Dec. 7, 2005, now abandoned.

(30) Foreign Application Priority Data

Dec. 14, 2004 (GB) .................................. 0427314.0

(51) Int. Cl.
*H01L 51/00* (2006.01)
*B05D 5/12* (2006.01)
(Continued)

(52) U.S. Cl.
CPC . *B05D 5/12* (2013.01); *B82Y 10/00* (2013.01); *H01L 31/18* (2013.01);
(Continued)

(58) Field of Classification Search
CPC .................................................. H01L 51/0015
See application file for complete search history.

(56) References Cited

U.S. PATENT DOCUMENTS 6,281,430 B1   8/2001   Lupo et al.
6,340,789 B1   1/2002   Petritsch et al.
(Continued)

FOREIGN PATENT DOCUMENTS

EP   0 707 020 A2   4/1996
EP   0 842 208      5/1998
(Continued)

OTHER PUBLICATIONS

Arias et al., "Vertically Segregated Polymer-Blend Photovoltaic Thin-Film Structures Through Surface-Mediated Solution Processing," *Appl. Phys. Lett.*, 80(10):1695-1697 (2002).
(Continued)

*Primary Examiner* — Stephen W Smoot
(74) *Attorney, Agent, or Firm* — Marshall, Gerstein & Borun LLP

(57) ABSTRACT

A method is provided to produce an opto-electronic device comprising a substrate, a first electrode layer, a second electrode layer of opposite polarity to said first electrode layer, any interlayers and, between said first and second electrode layers, a first functional material in interfacial contact with a second functional material, wherein the first functional material has the structure of a laterally porous film and the second functional material is a film disposed over and interpenetrating with the film of the first functional material.

25 Claims, 7 Drawing Sheets

(51) Int. Cl.
*H01L 51/50* (2006.01)
*B82Y 10/00* (2011.01)
*H01L 31/18* (2006.01)
*H01L 51/42* (2006.01)

(52) U.S. Cl.
CPC ....... *H01L 51/0003* (2013.01); *H01L 51/0015* (2013.01); *H01L 51/0026* (2013.01); *H01L 51/4253* (2013.01); *H01L 51/5048* (2013.01); *H01L 51/0036* (2013.01); *H01L 51/0037* (2013.01); *H01L 51/0046* (2013.01); *H01L 51/424* (2013.01); *H01L 51/50* (2013.01); *Y02E 10/549* (2013.01)

(56) References Cited

U.S. PATENT DOCUMENTS

| | | |
|---|---|---|
| 6,670,213 B2 | 12/2003 | Halls et al. |
| 2002/0189666 A1 | 12/2002 | Forrest et al. |
| 2002/0192441 A1* | 12/2002 | Kalkan et al. ............... 428/209 |
| 2004/0084080 A1 | 5/2004 | Sager et al. |
| 2004/0118448 A1 | 6/2004 | Scher et al. |
| 2005/0038792 A1 | 2/2005 | Johnson |
| 2005/0045874 A1* | 3/2005 | Xiao et al. ............... 257/40 |

FOREIGN PATENT DOCUMENTS

| | | |
|---|---|---|
| EP | 1 028 475 | 8/2000 |
| JP | 2002-117984 | 4/2002 |
| WO | WO-02/101352 | 12/2002 |
| WO | WO-2004/095599 | 11/2004 |

OTHER PUBLICATIONS

Feng et al., "Enhancement of Photoresponse by Enlarging the Effective Interface Between Conducting Polymer and Titanium Oxide in Photovoltaic Device," *Jap. J. Appl. Phys.*, 43(6A):3473-3478 (2004).
Gebeyehu et al., "Bulk Heterojunction Photovoltaic Devices Based on Donor Cceptor Organic Small Molecule Blends," *Solar Energy Materials and Solar Cells*, 79(1):248.
Halls et al., "Efficient Photodiodes from Interpenetrating Polymer Networks," *Nature*, 376:498-500 (1995).
Kymakis et al., "High Open-Circuit Voltage Photovoltaic Devices from Carbon-Nanotube-Polymer Composites," *J. Appl. Phys.*, 93(3):1764-1768 (2003).
Ma et al., "Preparation and Properties of Nanostructured TiO2 Electrode by a Polymer Organic-Medium Screen-Printing Technique," *Electrochemistry Communications*, 5(4):369-372 (2003).
Padinger et al., "Effects of Postproduction Treatment on Plastic Solar Cells," *Adv. Func. Matter.*, 13:85-88 (2003).
Setayesh et al., "Bridging the Gap Between Polyfluorene and Ladder-Poly-p-phenylene: Synthesis and Characterization of Poly-2,8-indenofluorene," *Macromolecules*, 33(6):2016-2020 (2000).
Waiheirn et al., "Nanophase-Separated Polymer Films as High-Performance Antireflection Coatings," *Science*, 283:520-522 (1999).
Yang et al., "Efficient Blue Polymer Light-Emitting Diodes from a Series of Soluble Poly(paraphenylene)s," *J. Appl. Phys.* 79(2):934-939 (1996).
Combined Search and Examination Report under Sections 17 & 18(3) for Application No. GB0427314.0, dated May 16, 2005.
International Preliminary Report on Patentability for International Application No. PCT/GB2005/004678, dated Jun. 19, 2007.
International Search Report for International Application No. PCT/GB2005/004678, dated Apr. 5, 2006.
Written Opinion for International Application No. PCT/GB2005/004678, dated Apr. 5, 2006.
USGS, "Former Spy Plane to the Rescue," http://egsc.usgs.gov/isb/pubs/booklets/scientists/spyplane.html (last retrieved Jan. 21, 2010).
Handbook of Photovoltaic Science and Engineering (edited by Antonio Luque and Steven Hegedus), available online Jan. 28, 2005, John Wiley & Sons Ltd., p. 62, fig. 3.1.

* cited by examiner

METHOD OF PREPARING OPTO-ELECTRONIC DEVICE

BACKGROUND OF THE INVENTION

1. Field of the Invention

This invention relates to methods of preparing opto-electronic devices such as photovoltaic (PV), photodetector, and organic light emitting diode (OLED) devices, in particular to methods to produce a large surface area interface between two functional layers of materials in these devices, such that each of the two layers of materials has a continuous non-tortuous exciton or electron/hole charge percolation path from the interface to its other surface without the presence of islands of material from one layer within the material of the other layer.

2. Related Technology

In opto-electronic devices such as PV and OLED devices, functional layers are sandwiched between an anode layer, generally of indium tin oxide (ITO) on a glass or polymer substrate, and a low work-function cathode layer such as aluminium/lithium fluoride. The functional layers include an electroluminescent or light-absorbing layer, and may include a hole transport layer and/or an electron transport layer. In these devices, charge carriers (electrons or holes) are transported to or from the electroluminescent or light-absorbing layer through a hole transport layer and/or an electron transport layer, from or to the cathode and anode layers. More specifically, charge carriers injected into an electroluminescent layer or generated by a light-absorbing layer will travel to or from the interface between the light-active layer and a hole transport layer or an electron transport layer, from or towards the relevant electrode at the other surface of the hole transport layer or an electron transport layer.

In general, the functional materials are deposited as layers over one electrode on a substrate, and the cell is completed by depositing the other electrode over the functional layers. Bi-layers of organic materials have been used for PV applications, for example a bi-layer of a light absorbing layer over a hole transporting layer. However, the bi-layer structure, in which the interface between the two layers is essentially planar, results in low quantum efficiencies, due to the small interfacial area existing between the two functional organic materials, and the mismatch between the typical exciton range and the thickness of polymer required to absorb most of the light.

Polymer blends have been used for organic PV and OLED applications. However, the blended structure, in which the two functional materials of the blend exist as separate but interdispersed phases, can also result in low quantum efficiencies despite the large interfacial contact between the two phases, due to the structure presenting long, tortuous percolation paths for exciton or electron/hole charges to travel to their collecting or source electrodes.

It would therefore be desirable to produce, in an opto-electronic device such as an organic PV device or an OLED device, an interface between bi-phasic functional layer materials that can provide not only an increased interfacial area compared with a bi-layered structure, but that also can present a shorter, less tortuous charge percolation path compared with a blended structure.

GENERAL DESCRIPTION OF THE INVENTION

The invention therefore provides a structure that is intermediate between the bi-layer and blend morphologies. This intermediate structure possesses both a large interfacial area between the material phases and simple non-tortuous percolation paths for excitons or electron/hole charges.

Waiheirn et al., Science, 1999, vol. 283, p 520-522 discloses a technique for creating nanoporous polymer films for use as anti-reflective optical coatings, by spin-coating a polymer blend of polystyrene (PS) and polymethyl methacrylate (PMMA), both dissolved in tetrahydrofuran, and evaporating the solvent to provide a polymer film exhibiting lateral phase morphology, followed by exposing the film to a selective solvent cyclohexane to selectively dissolve and remove the PS component to leave a laterally porous PMMA film exhibiting a specific optical property i.e. a low refractive index. The present invention uses this and similar techniques based on controlled nanoscale phase separation, for the preparation of opto-electronic devices.

Consequently, the invention enables the preparation of opto-electronic devices such as organic PV devices and OLED devices with controlled nanoscale phase separation that can exhibit greater device quantum efficiencies than corresponding devices that use bi-layered or blended structures The intermediate structure is formed by a laterally porous film of a first functional material such as a hole transporting material and a film of a second functional material such as a light-active material disposed over and interpenetrating with the film of the first functional material. In accordance with the methods of the invention, the first functional material is so formed as to provide a topographically rough, laterally porous surface to be coated with the film of the second functional material. When the second functional material is deposited over the surface of the first functional material, the second functional material enters the pores in the first functional material, and the troughs between the peaks of the first functional material, so as to form a complementary film over and interpenetrating with the film of the first functional material. The topographically rough interface between the first functional material and the second functional material provides a large contact area between the phases of the first and second functional materials, and simple non-tortuous percolation paths for excitons or electron/hole charges between the interface and the other respective surfaces of the first and second functional materials.

The invention has application in the fabrication of organic or hybrid (organic-inorganic) photovoltaic and photodetector devices, as well as other organic or hybrid opto-electronic devices.

According to the methods of the invention, a blend of a forming material as a first blend material, and a second blend material that is immiscible with the forming material, is deposited onto an electrode layer on a substrate. The second blend material may be the first functional material that is desired to be present in the final device, or may be a second forming material that will be removed and replaced by a functional material at a later stage of the process. In both cases, the forming material in the blend is specifically selected, depending on the second blend material, to give the desired phase separation so that the forming material and the second blend material separate into a laterally phase separated film structure of the forming material in a first phase and of the second blend material in a second phase. Moreover, the forming material in the blend is specifically selected so that any islands that may be formed, of one of the phases in the other of the phases, are islands of the second blend material within the forming material. Thus, when the forming material is later removed, the islands of the second blend material will also be removed with the forming material phase, so as to leave a pure phase of the second blend material. The phase separation scale may be controlled by appropriate selection of molecular weight of the forming material, solvent(s) for the blend materials, and deposition conditions.

The removal of the forming material, and of any islands therein, leaves a laterally porous, pure film of the second blend material.

In the case that the second blend material is a first functional material, the porous film may be used directly to form the opto-electronic device by depositing on it a second functional material. Alternatively, in the case that the second blend material is a second forming material, the porous film may be used as a template for the functional materials and thus employed indirectly to form the opto-electronic device.

Accordingly, in a first aspect, the invention provides a method of preparing an opto-electronic device comprising a substrate, a first electrode layer, a second electrode layer of opposite polarity to said first electrode layer and, between said first and second electrode layers, a first functional material in interfacial contact with a second functional material, said method comprising:

forming the first electrode layer on the substrate;

depositing a blend of a first forming material and a curable first functional material on said first electrode layer on said substrate to form a film, the first forming material and first functional material being selected to separate into a laterally phase separated film structure wherein the first forming material phase optionally contains islands of the first functional material phase;

treating said laterally phase separated film structure so as to cure said first functional material phase followed by removing the first forming material phase and said optionally contained islands of the first functional material phase, or removing the first forming material phase and said optionally contained islands of the first functional material phase from said laterally phase separated film structure followed by treating so as to cure said first functional material phase, to leave a cured, laterally porous film of said first functional material;

depositing a second functional material over and into the pores of said cured, laterally porous film of the first functional material, so as to provide a film of the second functional material over and interpenetrating with the film of the first functional material; and forming the second electrode layer over said film of the second functional material.

In a second aspect, the invention provides a method of preparing an opto-electronic device comprising a substrate, a first electrode layer, a second electrode layer of opposite polarity to said first electrode layer and, between said first and second electrode layers, a first functional material in interfacial contact with a second functional material, said method comprising:

forming the first electrode layer on the substrate;

depositing a blend of a first forming material and a second forming material on said first electrode layer on said substrate to form a film, the first forming material and second forming material being selected to separate into a laterally phase separated film structure wherein the first forming material phase optionally contains islands of the second forming material phase;

removing the first forming material phase and said optionally contained islands of the second forming material phase, to leave a laterally porous film of said second forming material;

depositing a curable first functional material over and into the pores of said laterally porous film of the second forming material, so as to provide a film of the first functional material over and interpenetrating with the film of the second forming material;

treating said interpenetrating films of the second forming and first functional materials so as to cure said first functional material phase followed by removing the second forming material and any uncured portions of the first functional material, or removing the second forming material and any uncured portions of the first functional material from said interpenetrating films of the second forming and first functional materials followed by treating so as to cure said first functional material phase, to leave a cured, laterally porous film of said first functional material;

depositing a second functional material over and into the pores of said cured, laterally porous film of the first functional material, so as to provide a film of the second functional material over and interpenetrating with the film of the first functional material; and forming the second electrode layer over said film of the second functional material.

In a preferred embodiment of the second aspect, the second forming material is UV-absorbent and the first functional material is UV-curable, and the treatment so as to cure said first functional material phase is by irradiating the interpenetrating films of the second forming and first functional materials with UV radiation through the substrate, whereby portions of the first functional material exposed to the UV radiation and not masked by the second forming material are cured and portions of the first functional material unexposed to the UV radiation or masked by the second forming material remain uncured.

In a third aspect, the invention provides an opto-electronic device comprising a substrate, a first electrode layer, a second electrode layer of opposite polarity to said first electrode layer and, between said first and second electrode layers, a first functional material in interfacial contact with a second functional material, wherein the first functional material has the structure of a laterally porous film and the second functional material is a film disposed over and interpenetrating with the film of the first functional material.

By 'laterally phase separated' as used herein is meant that the two principal phases co-exist such that the interface between the phases is essentially perpendicular to the plane of the film, which plane extends in the lateral direction. Thus, if the plane of the film extends laterally in the x and y directions, the interface between the phases extends essentially in the z direction so as to separate the phases across the lateral plane of the film. For example, one of the phases may exist as a plurality of separate and/or interconnected rod, ribbon and/or columnar structures that have their long axes oriented substantially normal to plane of the film, or may exist as a continuous phase containing a plurality of separate and/or interconnected rod-, ribbon- and/or column-shaped pores that have their long axes oriented substantially normal to plane of the film, with the space(s) between these structures and/or within the pores being constituted by the other of the two principal phases. Thus, the other of the two principal phases may also exist as a plurality of separate and/or interconnected rod, ribbon and/or columnar structures that have their long axes oriented substantially normal to plane of the film, or may exist as a continuous phase containing a plurality of separate and/or interconnected rod-, ribbon- and/or column-shaped pores that have their long axes oriented substantially normal to the plane of the film, with the space between these structures and/or within the pores being constituted by the one of the two principal phases.

Accordingly, by 'laterally porous film' as used herein is meant a film that has within it a plurality of separate and/or interconnected rod-, ribbon- and/or column-shaped pores or dimples that have their long axes oriented substantially normal to plane of the film, and/or that has on it a plurality of separate and/or interconnected rod-, ribbon- and/or column-shaped projections that have their long axes oriented substantially normal to plane of the film, such that the surfaces defined by the pores, dimples and/or projections is essentially perpendicular to the plane of the film, which plane extends in the lateral direction. Thus, if the plane of the laterally porous film extends laterally in the x and y directions, the surfaces defined by the pores, dimples and/or projections extend essentially in the z direction so as to separate the pores, dimples and/or projections across the lateral plane of the film.

The rod, ribbon and columnar structures in the laterally phase separated structures, and the rod-, ribbon- and column-shaped pores, dimples and projections of the laterally porous films, may be irregular in size and shape in cross-section, and may vary in cross-sectional size and shape over their axial extents. These rod, ribbon and columnar structures and pores, dimples and projections preferably have their axes spaced apart (in any cross-section in the plane of the film) by a distance in the range from 1 nm to 100 nm, more preferably in the range from 5 nm to 50 nm. The average size in cross-section of the rod, ribbon and columnar structures and pores, dimples and projections (in any cross-section in the plane of the film) preferably is in the range from 1 nm to 100 nm, more preferably in the range from 5 nm to 50 nm.

In a preferred embodiment, the device is an electroluminescent or OLED device, the first functional material is a charge transporting material, the second functional material is an electroluminescent material, the first electrode layer is the anode and the second electrode layer is the cathode.

In another preferred embodiment, the device is a photovoltaic device, the first functional material is a hole transporting material, the second functional material is an electron transporting material, the first electrode layer is the anode and the second electrode layer is the cathode.

The methods of the invention require a phase separation that is so controlled as to produce a topographically highly featured interface between the phases of the blend. Suitable techniques include those disclosed in Walheim et al., Science, 1999, vol. 283, p 520-522. The phase separation over the desired length scale can be controlled to this end by an appropriate selection of molecular weights for the polymers forming the blend, to provide a lateral gap between formed phase features of, for example, 10 to 25 nm. The film preferably has a thickness between the length scale of the lateral phase separation and the desired device thickness, for example a ratio of thickness to length scale of around 5:1-20:1.

The blend of first and second blend materials, in a suitable solvent, may be deposited by conventional techniques such as spin-coating, spray-coating, dip-coating, inkjet printing, screen printing, gravure printing, or flexographic printing. The solvent is removed, e.g. by evaporation, to leave a blend film having laterally phase separated morphology.

The curable second blend material is curable preferably by thermal annealing or UV crosslinking, in order that it may be cured by treating with heat or with UV radiation, respectively.

As mentioned, the first forming material phase as first blend material and any islands of the curable second blend material phase in the first blend material phase are removed by dissolving in a solvent for the first blend material, which solvent is insolvent for the cured second blend material. For example, if the first blend material is polystyrene, and the cured second blend material is UV-crosslinked poly(3-hexyl thiophene), a suitable selective solvent for the polystyrene is cyclohexane.

After removal of the first blend material phase and any islands of the second blend material phase in the first blend material phase, the cured second blend material having a topographically highly featured surface is further coated, either with a second functional material in the case that the second blend material is a first functional material, or with a first functional material in the case that the second blend material is a second forming material. The coating is deposited over and into the pores of the laterally porous film of the cured second blend material by spin-coating from a solvent for the coating material, which solvent is insolvent for the cured second blend material.

In the case that the second blend material is a first functional material, the coating will be a second functional material, and thus a topographically highly featured interface is formed between the two functional layers.

In the case that the second blend material is a second forming material, the coating will be a first functional material. After UV exposure and removal of the second forming material and any uncured first functional material, a coating of the second functional material is deposited over and into the pores of the laterally porous film of the cured first functional material by spin-coating from a solvent for the second functional material, which solvent is insolvent for the cured first functional material. Thus, a topographically highly featured interface is formed between the two functional layers.

Preferably, the first functional material forms a continuous layer over the first electrode, or the second functional material forms a continuous layer over the second electrode, or both, For example, materials such as amine—containing polymers, in particular polymers comprising one or more repeat units of formulae 1-6 shown below, are known to preferentially move to the substrate surface under certain conditions and when blended with certain materials.

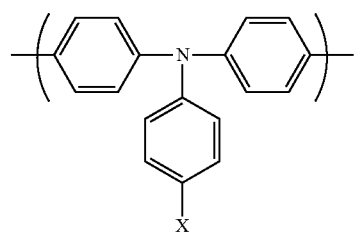

1

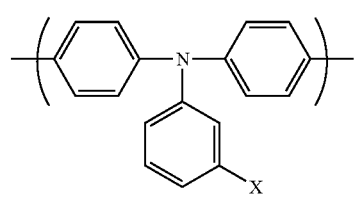

2

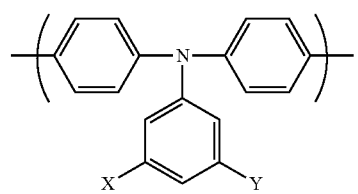

3

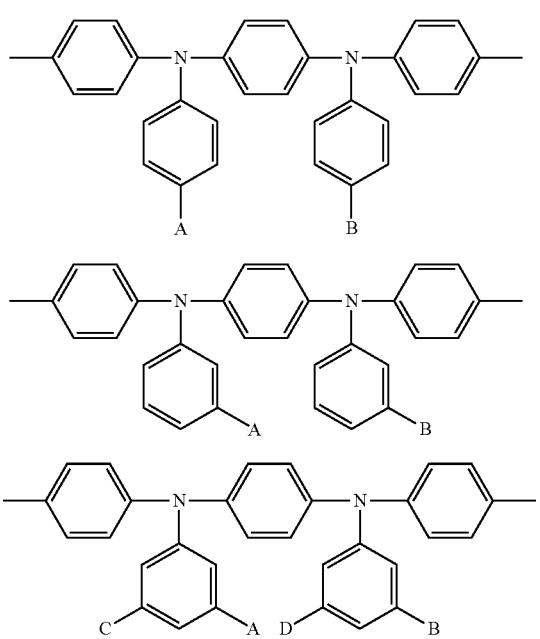

wherein X, Y, A, B, C and D are independently selected from H or a substituent group. More preferably, one or more of X, Y, A, B, C and D is independently selected from the group consisting of optionally substituted, branched or linear alkyl, aryl, perfluoroalkyl, thioalkyl, cyano, alkoxy, heteroaryl, alkylaryl and arylalkyl groups. Most preferably, X, Y, A and B are C1-10 alkyl.

Particularly preferred hole transporting polymers of this type are copolymers, in particular AB copolymers, comprising at least one triarylamine repeat unit of formula 1-6 and an arylene repeat unit. Preferred arylene repeat units are: 1,4-phenylene repeat units as disclosed in J. Appl. Phys. 1996, 79, 934; fluorene repeat units as disclosed in EP 0842208; indenofluorene repeat units as disclosed in, for example, Macromolecules 2000, 33(6), 2016-2020; and spirofluorene repeat units as disclosed in, for example, EP 0707020. Each of these repeat units is optionally substituted. Examples of substituents include solubilising groups such as C 1-20 alkyl or alkoxy; electron withdrawing groups such as fluorine, nitro or cyano; and substituents for increasing glass transition temperature (Tg) of the polymer.

Particularly preferred arylene repeat units comprise optionally substituted, 2,7-linked fluorenes, most preferably repeat units of formula (I):

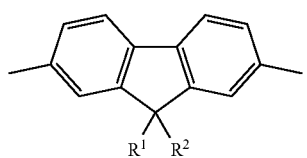

(I)

wherein R¹ and R2 are independently selected from hydrogen or optionally substituted alkyl, alkoxy, aryl, arylalkyl, heteroaryl and heteroarylalkyl. More preferably, at least one of R1 and R2 comprises an optionally substituted C4-C20 alkyl or aryl group.

It is believed that such a continuous layer of one or both functional materials over their respective electrodes will improve device performance by acting as a barrier to excitons and/or electrons, thus preventing or reducing quenching, by interrupting continuous leakage paths between the anode and cathode.

In a preferred embodiment, the first functional material is poly 3-hexyl thiophene functioning as hole collecting material, the second functional material is a polyfluorene functioning as light absorbing material, and the solvent for the polyfluorene is selected from toluene, xylene and chloroform.

In another embodiment, the first functional material is poly 3-hexyl thiophene functioning as hole collecting material, the second functional material is a fullerene functioning as light absorbing material, and the solvent for the fullerene is selected from chlorobenzene and dichlorobenzene.

If desired, the first electrode layer on the substrate may be formed with charge transporting layer of the first functional material on the first electrode layer, before the blend is deposited. Preferably, the first electrode layer is a layer indium tin-oxide (ITO) bearing a layer of PEDOT:PSS.

The invention has applications for organic PV/photodetector devices and for other electrical/opto-electrical devices.

BRIEF DESCRIPTION OF THE DRAWINGS

At least one embodiment of the invention will now be described, by way of example only, and with reference to the accompanying drawings in which.

DETAILED DESCRIPTION

The methods of the invention are further illustrated by the following non-limiting examples:

Examples

Method 1

Figure 1:
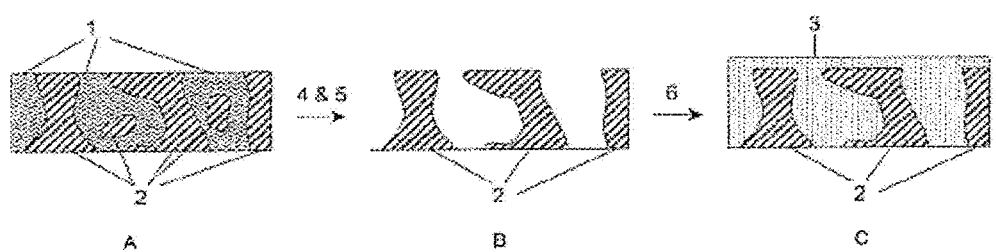
FIG. 1 is a schematic diagram of a process of phase separation according to a first embodiment of the invention.
Figure 2:
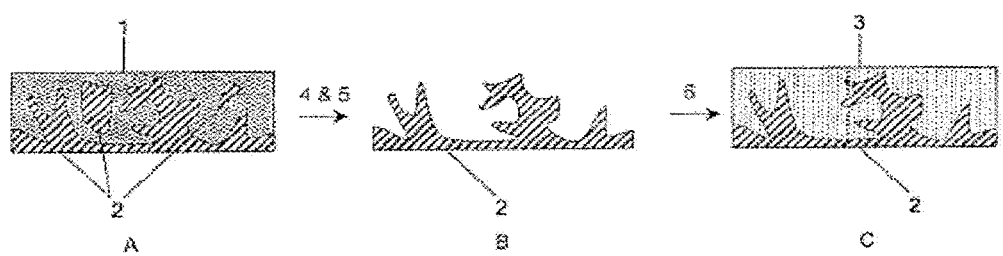
FIG. 2 is a schematic diagram of a process of phase separation according to a second embodiment of the invention.

A polymer blend of Material 1 and Material 2 is spin-coated onto a substrate, although other methods such as spray-coating, dip-coating, ink-jet printing, screen printing, gravure printing or flexographic printing could instead be used. Two possible forms of phase separation are shown in FIGS. 1A and 2A:

FIGS. 1 and 2 illustrate the process of phase separation, selective dissolution of Material 2, and re-filling with polymer Material 3. Materials 1 and 2 are seen to have formed a laterally phase separated structure in FIGS. 1A and 2A following the polymer blend deposition and phase separation process. In FIG. 2A, the materials are shown to have phase separated with functional Material 2 preferentially contacting with the substrate, so as to form a continuous layer of Material 2 over the substrate. In a PV device, for example, Material 2 is the donor material (hole acceptor and transporter) in the completed cell. Material 1 is selected to provide the desired phase separated structure when blended with Material 2 and spin-cast from solution. The phase separation scale is controlled, for example, by appropriate selection of molecular weight, solvent, solvent mix and deposition conditions.

Once formed, the phase-separated film is subjected to a process step (4) that renders Material 2 insoluble or partially insoluble, for example thermal annealing or UV cross-linking. The film is then subjected to a process step (5) that selectively dissolves Material 1, leaving behind a topographically highly featured porous film of Material 2, as depicted in FIGS. 1B and 2B. Material 3 is then deposited on top of the porous film by a process step (6), to provide a bi-layer of functional Materials 2 and 3 with a topographically highly featured interface.

Suitable materials and process steps are shown below:

Example A

A blend of polystyrene (various Mw available to give correct phase separation) and poly 3-hexyl thiophene (P3HT) are deposited from xylene solution followed by baking at 180° C to cure the poly 3-hexyl thiophene. Polystyrene is removed by spin rinsing the phase separated blend with cyclohexane. Finally, Polymer I, having the structure shown below, is deposited from xylene solution. Heat treatment of P3HT renders it at least partially insoluble in xylene, thus enabling deposition of Polymer 1 from this solvent in order to form an interpenetrating film of P3HT and Polymer 1.

The baking step may also take place after removal of polystyrene due to the relative insolubility of P3HT in cyclohexane.

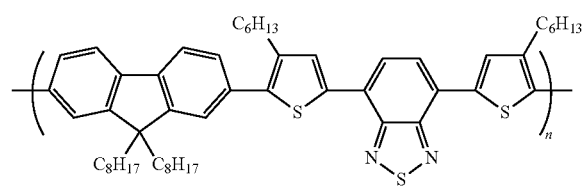

Polymer 1

Example B

The procedure of Example A is repeated except that P3HT is provided with UV cross-linkable groups and the P3HT component of the blend layer is cured by UV treatment to cross-link the P3HT material. Curing by cross-linking renders Polymer 1 insoluble in more solvents than heat treatment of the non-crosslinked P3HT material of Example A and as such Polymer 1 may be deposited by spin-coating from toluene or xylene or chloroform (lower viscosity).

Example C

The procedure of Example B is repeated except that the cross-linkable P3HT is crosslinked by thermal rather than UV treatment. It will be appreciated by the skilled person that a wide range of cross-linkable groups are available, and an appropriate one may be selected according to the desired cross-linking conditions.

Example D

The procedure of Example B is repeated but with Polymer 1 being replaced with PBCM (soluble substituted fullerene 1-(3-methoxycarbonyl)propyl-1-phenyl[6,6]$C_{61}$) and adding chlorobenzene and dichlorobenzene to solvents for deposition of the fullerene.

Example E

The procedure of Example C is repeated but with Polymer I being replaced with PBCM (soluble substituted fullerene 1-(3-methoxycarbonyl)propyl-1-phenyl[6,6]$C_{61}$) and adding chlorobenzene and dichlorobenzene to solvents for deposition of the fullerene.

Method 2

Figure 3:
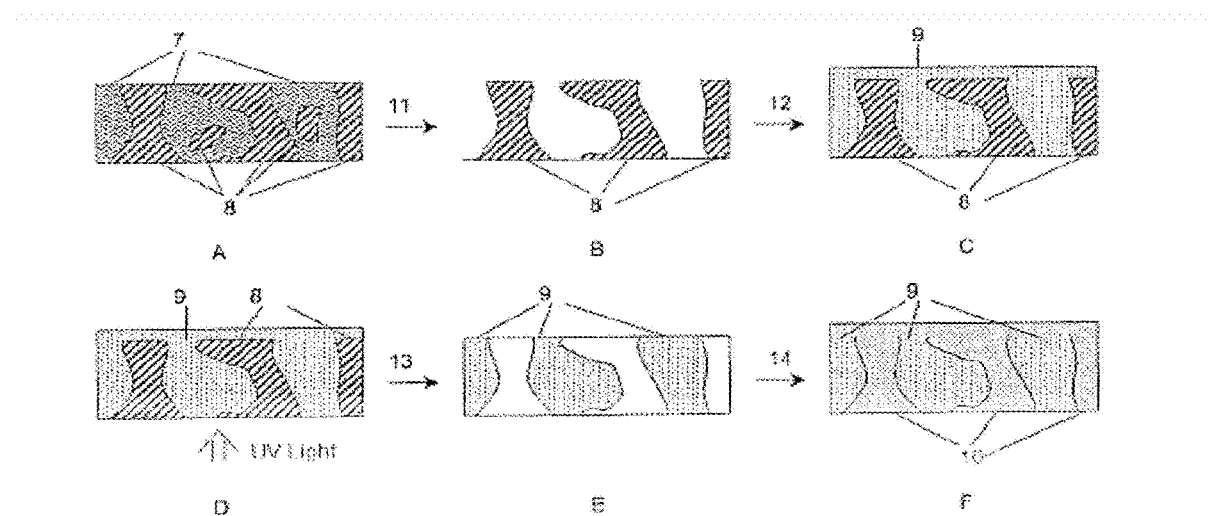
FIG. 3 is a schematic diagram of a process of phase separation according to a third embodiment of the invention.

Referring to FIG. 3, a blend is made of two polymer Materials 7 and 8 having molecular weights so chosen such that controlled phase separation over the desired scale is achieved, and is deposited as a film on the substrate, as shown in FIG. 3A. First forming Material 7 is dissolved away. The remaining second forming Material 8 is a strong absorber in the UV spectrum. After removal of Material 7 in process step 11, the first functional Material 9, which is UV curable, is deposited on the substrate in process step 12. Materials 8 and 9 are exposed to UV radiation from the substrate side and the phase separated UV-absorbent Material 8 acts as the mask so that only Material 9 in the wells is cured sufficiently to make it insoluble, as shown in FIG. 3D. Material 8 and the uncured phase-separated Material 9 are then removed in process step 13, leaving behind islands of cured Material 9 as shown in FIG. 3E. The second functional Material 10 is then deposited, in process step 14, yielding the final interpenetrating network of pure Materials 9 and 10 as shown in FIG. 3F.

Figure 4:
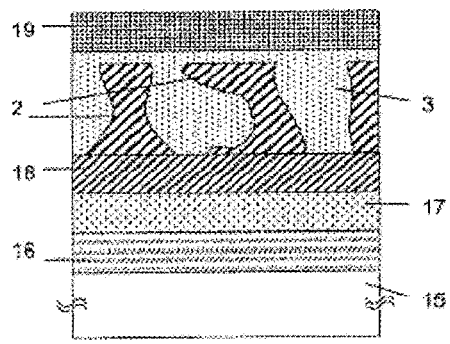
FIG. 4 is a schematic diagram of a PV device structure incorporating an interpenetrating bi-layer according to the invention.

FIG. 4 shows a PV device structure incorporating an interpenetrating bi-layer according to the invention. A glass substrate 15 is coated with indium tin-oxide 16 and, on top of this, a layer of PEDOT:PSS 17 is spin-coated. A thin (<20 nm) layer of the hole transport material 2 is deposited to form an anode interlayer 18. An interpenetrating network of hole transport material 2 and electron transport layer 3 are formed in accordance with the method of the invention. An additional cathode interlayer (not shown) may also be deposited. Finally the device structure is completed with a low-workfunction cathode 19.

Figure 5:
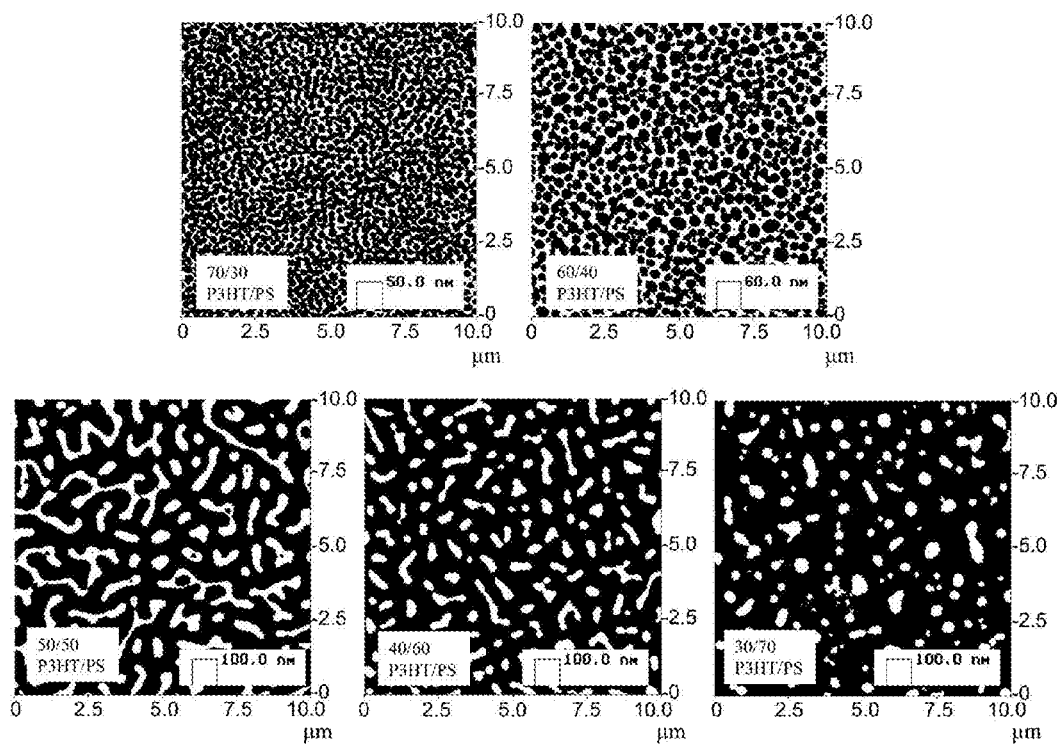
FIG. 5 is an Atomic Force Microscopy image illustrating the effect of different ratios of P3HT to Polystyrene upon the structure of the P3HT film before having a polymer 1 formed on top.
Figure 6:
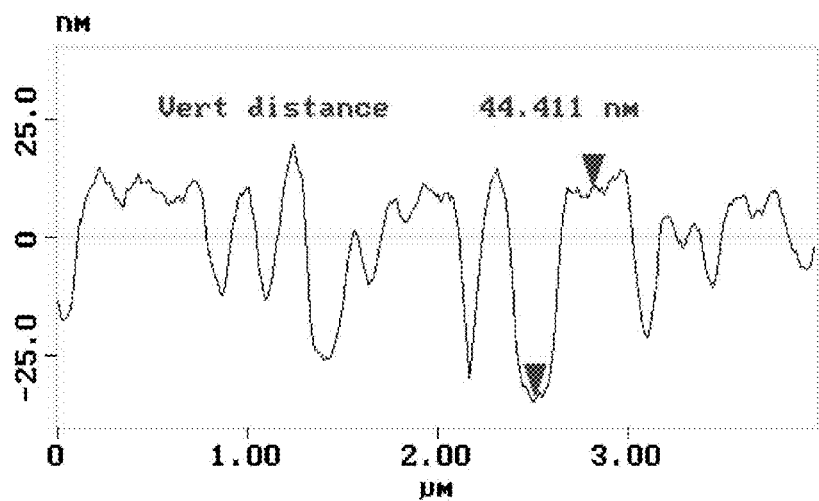
FIG. 6 is a cross-section through the Atomic Force Microscopy image of FIG. 5 formed from a 70/30 P3HT/PS ratio.
Figure 7:
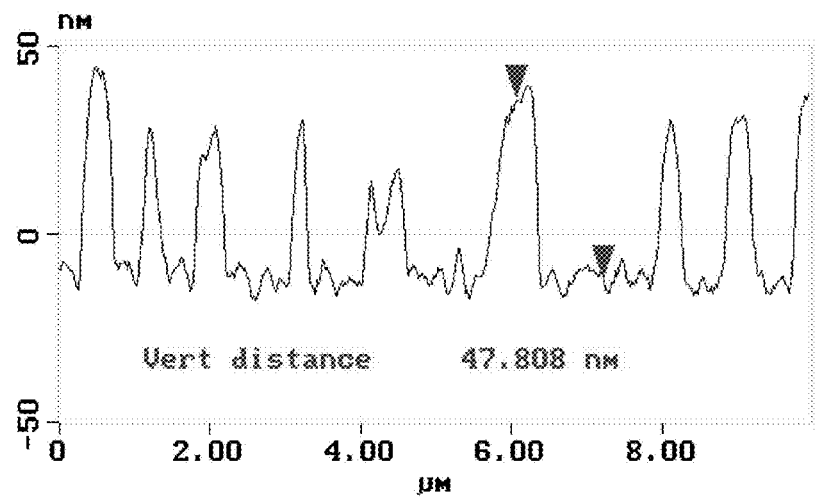
FIG. 7 is a cross-section through the Atomic Force Microscopy image of FIG. 5 formed from a 30/70 P3HT/PS ratio.

Referring to FIG. 5, the different ratios of P3HT to Polystyrene produce a variety of structures in the P3HT films. The 70/30 and 60/40 ratios produce continuous porous films, the 50/50 ratio produces films at the percolation limit and the 40/60 and 30/70 ratios produce isolated islands of P3HT. Although different height scales are used to display the images, the cross-section illustrated in FIG. 6 for 70/30 P3HT/PS and FIG. 7 for 30/70 P3HT/PS, show that the P3HT areas are all around 45-50 nm higher than the substrate.

Figure 8:
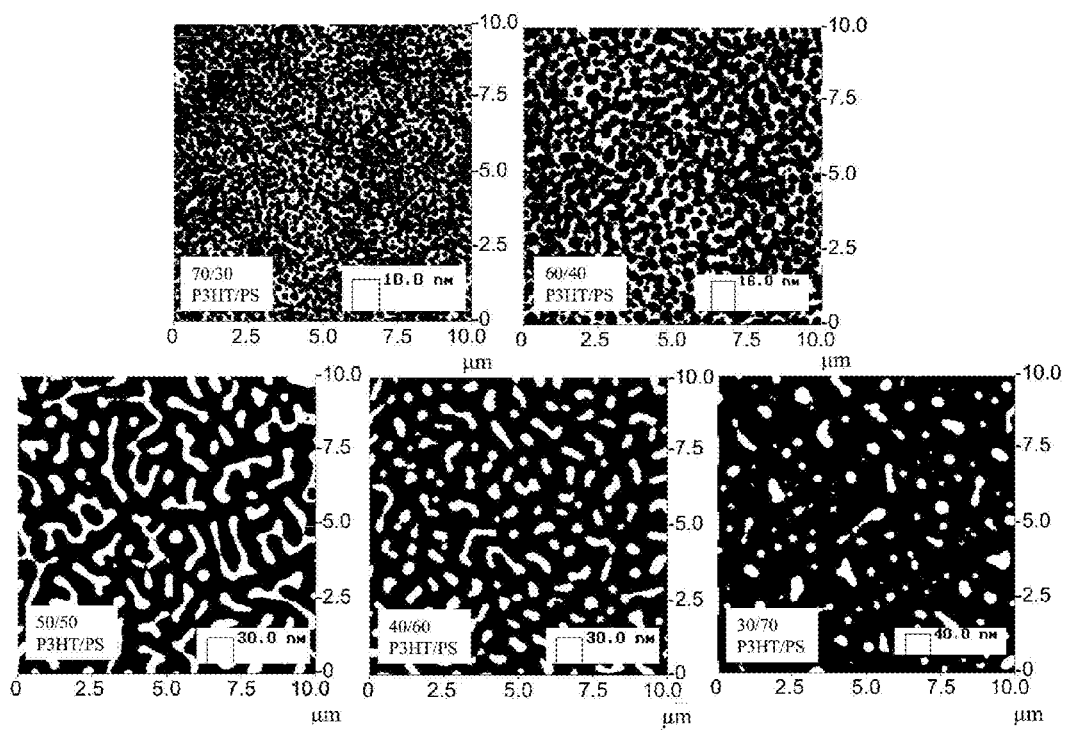
FIG. 8 is an Atomic Force Microscopy image illustrating the effect of different ratios of P3HT to Polystyrene upon the structure of the P3HT film having a polymer 1 formed on top.
Figure 9:
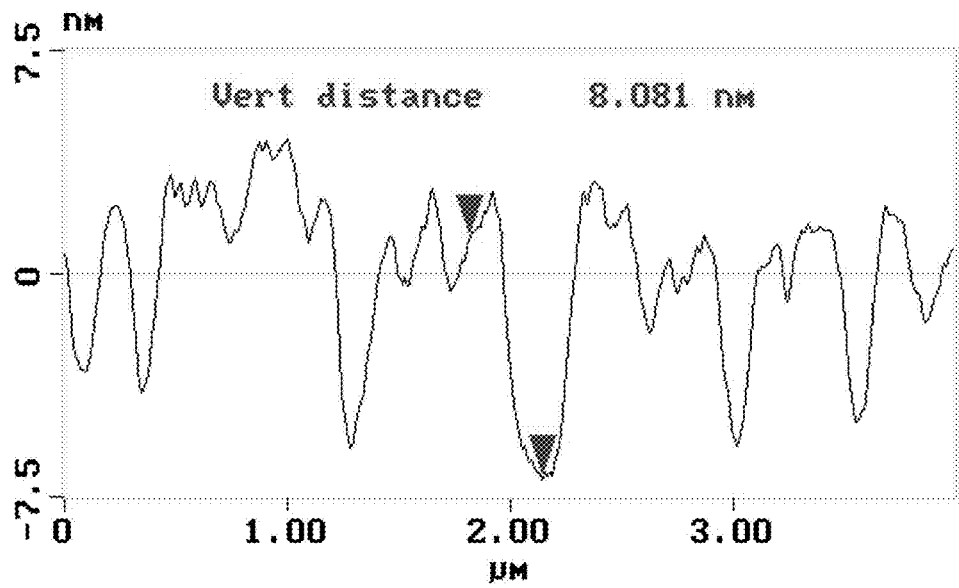
FIG. 9 is a cross-section through the Atomic Force Microscopy image of FIG. 8 formed from a 70/30 P3HT/PS ratio.
Figure 10:
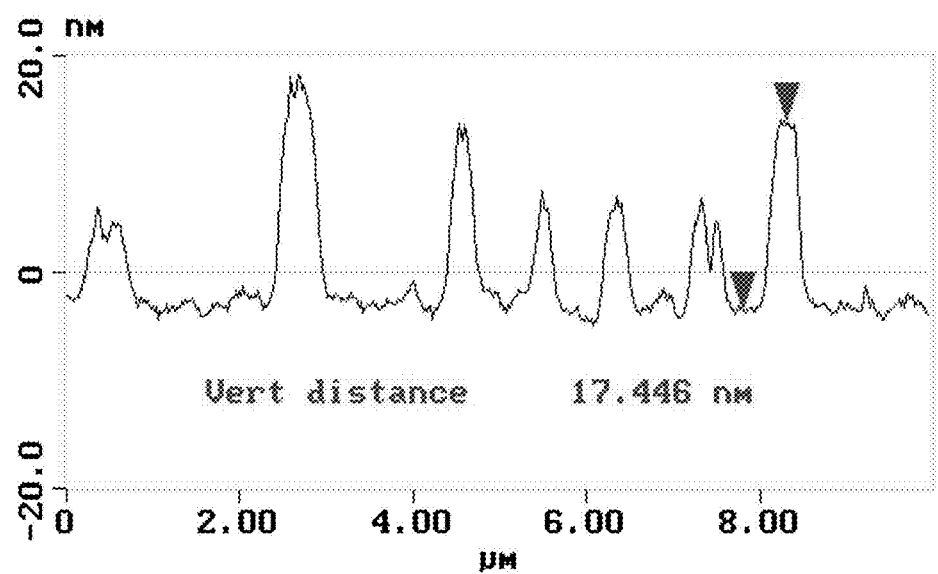
FIG. 10 is a cross-section through the Atomic Force Microscopy image of FIG. 8 formed from a 30/70 P3HT/PS ratio.

Referring to FIG. 8, the application of polymer 1 on top of the P3HT does not appear to have significantly, visually at least, changed the surface topography compared to that illustrated in FIG. 5. However, as best seen in FIGS. 9 and 10, a cross-section taken across the surface of the topography of FIG. 8, show that the undulations have significantly reduced by applying Polymer 1 on top of the P3HT.

Figure 11:
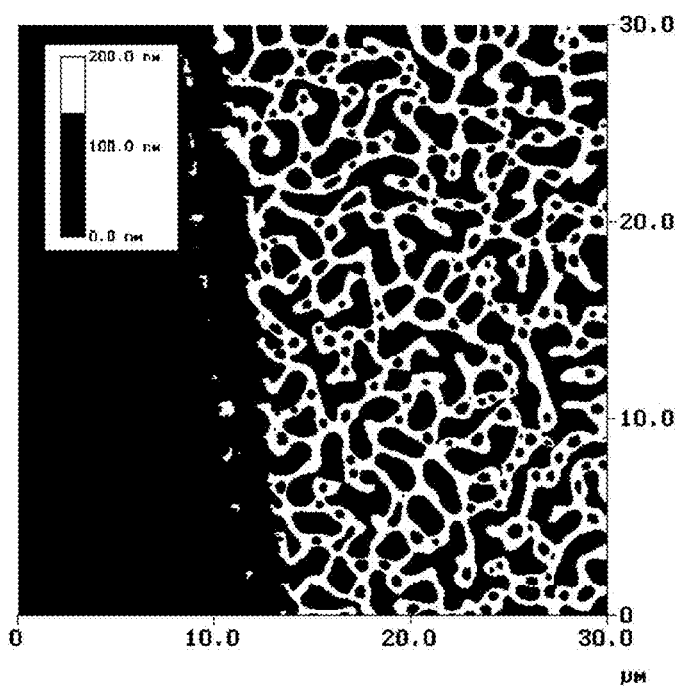
FIG. 11 is an Atomic Force Microscopy image of a scratch to reveal the substrate below before having a polymer formed on top.
Figure 12:
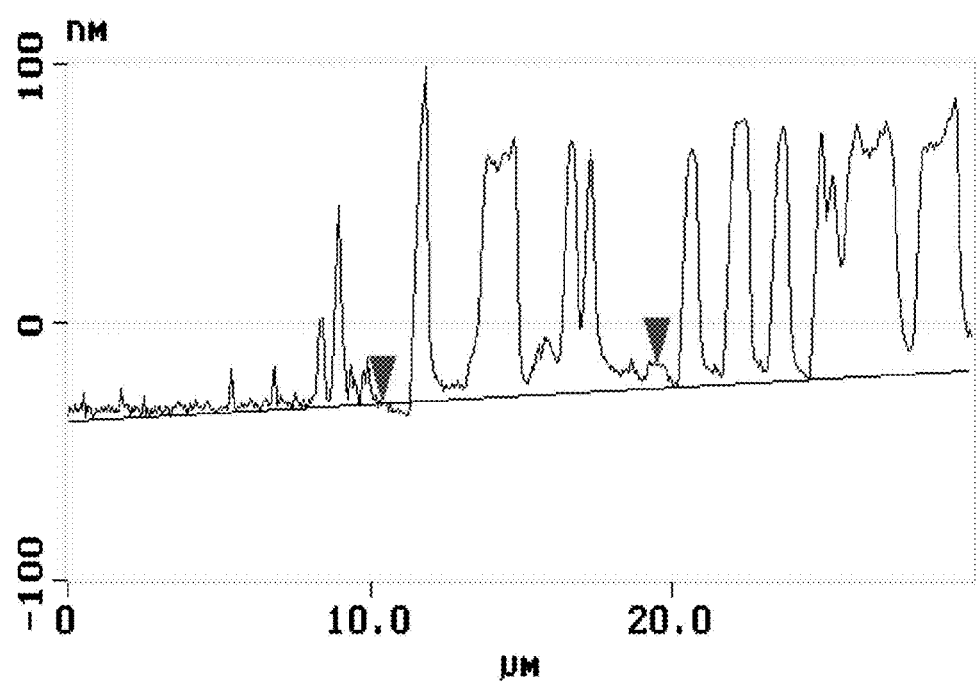
FIG. 12 is a cross-section through the Atomic Force Microscopy image of FIG. 11.

FIGS. 11 and 12 illustrate an Atomic Force Microscopy (AFM) image of a scratch in a partial P3HT film and a corresponding cross-section. FIGS. 11 and 12 demonstrate that the holes left when the polystyrene was dissolved away in the cyclohexane, do continue the majority, if not all the way through the substrate. Accordingly, in a complete device, Polymer 1 will extend from one electrode to the other, whereas P3HT will only be in contact with the anode.

Figure 13:
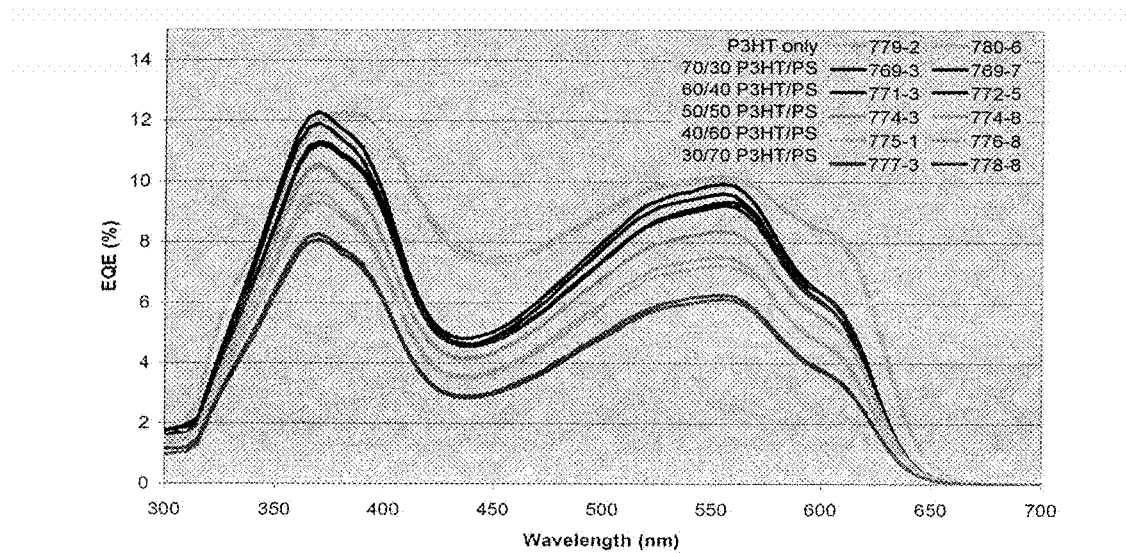
FIG. 13 is a spectral response of a number of P3HT/Polymer 1 bilayer devices.

FIG. 13 illustrates spectra from a number of P3HT/Polymer 1 bilayer devices and the porous/partial-P3HT/Polymer 1 devices based upon Example A as previously described. Example A was completed into a device on top of a Glass/ITO/PEDOT:PSS structure and completed with an Al or LiF/Al cathode. The maximum EQE's for the P3HT/Polymer 1 bilayer and the device fabricated with the 70/30 P3HT/PS film are substantially the same, whereas the broadness of the peaks are different.

The invention claimed is:

1. A method of preparing an opto-electronic device comprising a substrate, a first electrode layer, a second electrode layer of opposite polarity to said first electrode layer, and, between said first and second electrode layers, a first functional material in interfacial contact with a second functional material, said method comprising:
   forming the first electrode layer on the substrate;
   depositing a blend of a first forming material and a curable first functional material on said first electrode layer on said substrate to form a film, the first forming material and the first functional material being selected to separate into a laterally phase separated film structure of the first forming material in a first forming material phase and of the first functional material in a first functional material phase wherein the first forming material phase optionally contains islands of the first functional material phase;
   treating said laterally phase separated film structure so as to cure said first functional material phase followed by removing the first forming material phase and said optionally contained islands of the first functional material phase, or removing the first forming material phase and said optionally contained islands of the first functional material phase from said laterally phase separated film structure followed by treating so as to cure said first functional material phase, to leave a cured, laterally porous film of said first functional material;
   depositing a second functional material over and into the pores of said cured, laterally porous film of the first functional material, so as to provide a film of the second functional material over and interpenetrating with the film of the first functional material; and
   forming the second electrode layer over said film of the second functional material.

2. A method according to claim 1, comprising removing the first forming material phase and said optionally contained islands by dissolving in a solvent for the first forming material, which solvent is insolvent for the cured first functional material.

3. A method according to claim 2, wherein the first forming material is polystyrene and the solvent is cyclohexane.

4. A method according to claim 1, wherein the device is an electroluminescent or OLED device; the first functional material is a charge transporting material; the second functional material is an electroluminescent material; the first electrode layer is the anode and the second electrode layer is the cathode.

5. A method according to claim 1, wherein the device is a photovoltaic device; the first functional material is a hole transporting material; the second functional material is an electron transporting material; the first electrode layer is the anode and the second electrode layer is the cathode.

6. A method according to claim 1, wherein the curable first functional material is curable by thermal annealing and/or UV-cross-linking, and is cured by treating with heat and/or UV radiation.

7. A method according to claim 1, wherein the first forming material is polystyrene.

8. A method according to claim 1, comprising depositing the blend by a technique selected from the group consisting of spin-coating, spray-coating, dip-coating, inkjet printing, screen printing, gravure printing, and flexographic printing.

9. A method according to claim 1, comprising depositing the second functional material over and into the pores of the laterally porous film of the cured first functional material by a technique selected from the group consisting of spin-coating, spray-coating, dip-coating, inkjet printing, screen printing, gravure printing, and flexographic printing from a solvent for the second functional material, which solvent is insolvent for the cured first functional material.

10. A method according to claim 1, wherein the first functional material is poly 3-hexyl thiophene functioning as hole collecting material, the second functional material is a polyfluorene functioning as an electron collecting material.

11. A method according to claim 1, wherein the first functional material is poly 3-hexyl thiophene functioning as hole collecting material, the second functional material is a fullerene functioning as an electron collecting material.

12. A method according to claim 1, wherein one or both of the first and second functional materials is or are a light absorbing material.

13. A method according to claim 1, further comprising forming a charge transporting layer of said first functional material on the first electrode layer on the substrate, before said blend is deposited.

14. A method according to claim 1, wherein the first electrode layer is a layer of indium tin-oxide (ITO) bearing a layer of PEDOT:PSS.

15. A method of preparing an opto-electronic device comprising a substrate, a first electrode layer, a second electrode layer of opposite polarity to said first electrode layer and, between said first and second electrode layers, a first functional material in interfacial contact with a second functional material, said method comprising:
   forming the first electrode layer on the substrate;
   depositing a blend of a first forming material and a second forming material on said first electrode layer on said substrate to form a film, the first forming material and second forming material being selected to separate into a laterally phase separated film structure of the first forming material in a first forming material phase and of the second forming material in a second forming material phase wherein the first forming material phase optionally contains islands of the second forming material phase;

removing the first forming material phase and said optionally contained islands of the second forming material phase, to leave a laterally porous film of said second forming material;

depositing a curable first functional material over and into the pores of said laterally porous film of the second forming material, so as to provide a film of the first functional material over and interpenetrating with the film of the second forming material;

treating said interpenetrating films of the second forming and first functional materials so as to cure said first functional material followed by removing the second forming material and any uncured portions of the first functional material, or removing the second forming material from said interpenetrating films of the second forming and first functional materials followed by treating so as to cure said first functional material, to leave a cured, laterally porous film of said first functional material;

depositing a second functional material over and into the pores of said cured, laterally porous film of the first functional material, so as to provide a film of the second functional material over and interpenetrating with the film of the first functional material; and forming the second electrode layer over said film of the second functional material.

16. A method according to claim 15, wherein said second forming material is UV-absorbent and said first functional material is UV-curable, and said treating so as to cure said first functional material phase comprises irradiating said interpenetrating films of the second forming and first functional materials with UV radiation through the substrate, whereby portions of the first functional material exposed to the UV radiation and not masked by the second forming material are cured and portions of the first functional material unexposed to the UV radiation or masked by the second forming material remain uncured.

17. A method according to claim 15, comprising removing the first forming material phase and said optionally contained islands by dissolving in a solvent for the first forming material, which solvent is insolvent for the second forming material, and removing the second forming material phase and said optionally contained islands by dissolving in a solvent for the second forming material, which solvent is insolvent for the cured first functional material.

18. A method according to claim 15, comprising depositing the first functional material over and into the pores of the laterally porous film of the second forming material by a technique selected from the group consisting of spin-coating, spray-coating, dip-coating, inkjet printing, screen printing, gravure printing, and flexographic printing from a solvent for the first functional material, which solvent is insolvent for the second forming material.

19. A method according to claim 15, wherein the device is an electroluminescent or OLED device; the first functional material is a charge transporting material; the second functional material is an electroluminescent material; the first electrode layer is the anode and the second electrode layer is the cathode.

20. A method according to claim 15, wherein the device is a photovoltaic device; the first functional material is a hole transporting material; the second functional material is an electron transporting material; the first electrode layer is the anode and the second electrode layer is the cathode.

21. A method according to claim 15, wherein the curable first functional material is curable by thermal annealing and/or UV-cross-linking, and is cured by treating with heat and/or UV radiation.

22. A method according to claim 15, wherein the first forming material is polystyrene.

23. A method according to claim 15, wherein the first functional material is poly 3-hexyl thiophene functioning as hole collecting material, the second functional material is a polyfluorene functioning as an electron collecting material.

24. A method according to claim 15, wherein the first functional material is poly 3-hexyl thiophene functioning as hole collecting material, the second functional material is a fullerene functioning as an electron collecting material.

25. A method according to claim 15, wherein one or both of the first and second functional materials is or are a light absorbing material.

* * * * *